(12) United States Patent
Endo et al.

(10) Patent No.: US 10,017,664 B2
(45) Date of Patent: Jul. 10, 2018

(54) NOVOLAC RESIN-CONTAINING RESIST UNDERLAYER FILM-FORMING COMPOSITION USING BISPHENOL ALDEHYDE

(71) Applicant: NISSAN CHEMICAL INDUSTRIES, LTD., Tokyo (JP)

(72) Inventors: Takafumi Endo, Toyama (JP); Keisuke Hashimoto, Toyama (JP); Hirokazu Nishimaki, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 1 day.

(21) Appl. No.: 14/786,044

(22) PCT Filed: May 8, 2014

(86) PCT No.: PCT/JP2014/062352
§ 371 (c)(1),
(2) Date: Oct. 21, 2015

(87) PCT Pub. No.: WO2014/185335
PCT Pub. Date: Nov. 20, 2014

(65) Prior Publication Data
US 2016/0068709 A1 Mar. 10, 2016

(30) Foreign Application Priority Data
May 13, 2013 (JP) .................................. 2013-101345

(51) Int. Cl.
*C07C 39/15* (2006.01)
*G03F 7/11* (2006.01)
(Continued)

(52) U.S. Cl.
CPC ........... *C09D 179/02* (2013.01); *C08G 73/06* (2013.01); *C09D 161/12* (2013.01); *C09D 179/04* (2013.01); *G03F 7/091* (2013.01); *G03F 7/094* (2013.01); *H01L 21/31138* (2013.01); *H01L 21/31144* (2013.01)

(58) Field of Classification Search
CPC ....... C09D 179/02; G03F 7/091; G03F 7/094; C08G 73/0622; C08G 73/0666; C08G 73/0672; H01L 21/31138; H01L 21/31144
See application file for complete search history.

(56) References Cited

U.S. PATENT DOCUMENTS

| | | | |
|---|---|---|---|
| 7,378,217 | B2 | 5/2008 | Oh et al. |
| 9,230,827 | B2* | 1/2016 | Nonaka .................. G03F 7/094 |
| 2012/0184103 | A1* | 7/2012 | Ogihara .................. G03F 7/094 |
| | | | 438/703 |

FOREIGN PATENT DOCUMENTS

| | | |
|---|---|---|
| JP | H01-154050 A | 6/1989 |
| JP | H02-22657 A | 1/1990 |

(Continued)

OTHER PUBLICATIONS

Aug. 12, 2014 Written Opinion issued in International Patent Application No. PCT/JP2014/062352.
(Continued)

*Primary Examiner* — Cynthia Hamilton
(74) *Attorney, Agent, or Firm* — Oliff PLC

(57) ABSTRACT

Resist underlayer film-forming composition for forming resist underlayer film with high dry etching resistance, wiggling resistance and exerts good flattening property and embedding property for uneven parts, including resin obtained by reacting organic compound A including aromatic ring and aldehyde B having at least two aromatic hydrocarbon ring groups having phenolic hydroxy group and having structure wherein the aromatic hydrocarbon ring groups are bonded through tertiary carbon atom. The aldehyde B may be compound of Formula (1):

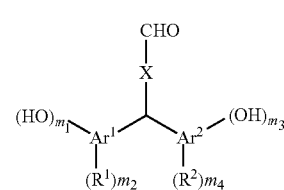

Formula (1)

The obtained resin may have a unit structure of Formula (2):

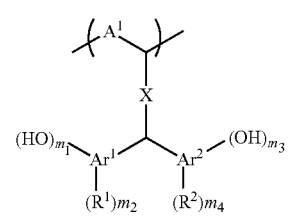

Formula (2)

$Ar^1$ and $Ar^2$ each are $C_{6-40}$ aryl group. The organic compound A including aromatic ring may be aromatic amine or phenolic hydroxy group-containing compound. The composition may contain further solvent, acid and/or acid generator, or crosslinking agent. Forming resist pattern used for semiconductor production, including forming resist underlayer film by applying the resist underlayer film-forming composition onto semiconductor substrate and baking it.

12 Claims, No Drawings

(51) Int. Cl.
*G03F 7/32* (2006.01)
*C07C 37/68* (2006.01)
*G03F 7/16* (2006.01)
*C09D 179/02* (2006.01)
*C09D 179/04* (2006.01)
*C09D 161/12* (2006.01)
*G03F 7/09* (2006.01)
*H01L 21/311* (2006.01)
*C08G 73/06* (2006.01)

(56) References Cited

FOREIGN PATENT DOCUMENTS

| | | |
|---|---|---|
| JP | H02-293850 A | 12/1990 |
| JP | H05-125149 A | 5/1993 |
| JP | H07-268049 A | 10/1995 |
| JP | 2005-128509 A | 5/2005 |
| JP | 2006-259249 A | 9/2006 |
| JP | 2007-178974 A | 7/2007 |
| JP | 2007-199653 A | 8/2007 |
| JP | 2012-098431 A | 5/2012 |
| JP | 2012-145897 A | 8/2012 |
| WO | 2010/147155 A1 | 12/2010 |

OTHER PUBLICATIONS

Aug. 12, 2014 Search Report issued in International Patent Application No. PCT/JP2014/062352.

\* cited by examiner

NOVOLAC RESIN-CONTAINING RESIST UNDERLAYER FILM-FORMING COMPOSITION USING BISPHENOL ALDEHYDE

TECHNICAL FIELD

The present invention relates to a resist underlayer film-forming composition for lithography that is effective at the time of semiconductor substrate processing, a method for forming a resist pattern using the resist underlayer film-forming composition, and a method for producing a semiconductor device.

BACKGROUND ART

Conventionally, microfabrication has been carried out by lithography using a photoresist composition in the production of semiconductor devices. The microfabrication is a method for processing including forming a thin film of a photoresist composition on a substrate to be processed such as a silicon wafer, irradiating the thin film with active light such as ultraviolet rays through a mask pattern in which a pattern of a semiconductor device is depicted, developing the pattern, and etching the substrate to be processed such as a silicon wafer by using the obtained photoresist pattern as a protection film. In recent years, however, semiconductor devices have been further integrated, and the active light to be used has had a shorter wavelength from a KrF excimer laser (248 nm) to an ArF excimer laser (193 nm). This raises serious problems of the effects of diffused reflection of active light from the substrate and standing wave. Consequently, a method for providing a bottom anti-reflective coating (BARC) between a photoresist and a substrate to be processed has been widely applied. In order to achieve further microfabrication, a lithography technique using extreme ultraviolet rays (EUV, wavelength 13.5 nm) and electron beams (EB) as the active light. In the EUV lithography or the EB lithography, a specific anti-reflective coating is not required because the diffused reflection from the substrate and the standing wave are not usually generated. The resist underlayer film, however, has begun to be widely studied as an auxiliary film for improving the resolution of a resist pattern and adhesion.

On the other hand, as the finer resist pattern formation has been progressed, thinner film formation of the resist has been indispensable. This is because deterioration in resolution is caused by the finer pattern formation and the formed resist pattern is easily collapsed. Consequently, the resist pattern thickness required for substrate processing is difficult to retain. As a result, not only the resist pattern but also the resist underlayer film formed between the resist and the semiconductor substrate to be processed are required to have the function as a mask. In order to form the resist film having a thinner film thickness as described above, a lithography process is used in which at least two layers of resist underlayer films are formed and the resist underlayer films are used as an etching mask. For such a thin film resist, a process of transferring a resist pattern to the underlayer film of the resist by an etching process; and processing a substrate using the underlayer film as a mask, or a process of transferring a resist pattern to the underlayer film of the resist by an etching process; further transferring the transferred pattern of the underlayer film to the underlayer film of the patterned underlayer film using a different etching gas; repeating these processes; and finally processing the substrate is used. The resist underlayer film for the lithography process is required to have high etching resistance to the etching gas (for example, fluorocarbons) in a dry etching process and the like.

As the polymer for the resist underlayer film, the following polymers are exemplified.

A resist underlayer film-forming composition including polyvinyl carbazole is exemplified (refer to Patent Document 1, Patent Document 2, and Patent Document 3).

A resist underlayer film-forming composition using a fluorene phenol novolac resin is disclosed (for example, refer to Patent Document 4).

A resist underlayer film-forming composition including a fluorenenaphthol novolac resin is disclosed (for example, refer to Patent Document 5).

A resist underlayer film-forming composition containing a resin made of fluorenephenol and arylalkylene as repeating units is disclosed (for example, refer to Patent Document 6 and Patent Document 7).

A resist underlayer film-forming composition including carbazole novolac is disclosed (for example, refer to Patent Document 8).

A resist underlayer film-forming composition including polynuclear phenol novolac is disclosed (for example, refer to Patent Document 9).

PRIOR ART DOCUMENTS

Patent Documents

Patent Document 1: Japanese Patent Application Publication No. H2-293850 (JP H2-293850 A)
Patent Document 2: Japanese Patent Application Publication No. H1-154050 (JP H1-154050 A)
Patent Document 3: Japanese Patent Application Publication No. H2-22657 (JP H2-22657 A)
Patent Document 4: Japanese Patent Application Publication No. 2005-128509 (JP 2005-128509 A)
Patent Document 5: Japanese Patent Application Publication No. 2007-199653 (JP 2007-199653 A)
Patent Document 6: Japanese Patent Application Publication No. 2007-178974 (JP 2007-178974 A)
Patent Document 7: U.S. Pat. No. 7,378,217
Patent Document 8: WO 2010/147155 Pamphlet
Patent Document 9: Japanese Patent Application Publication No. 2006-259249 (JP 2006-259249 A)

SUMMARY OF THE INVENTION

Problem to be Solved by the Invention

In recent years, in association with finer resist pattern formation, a problem in which, in a resist underlayer film used as an etching mask, a desired pattern is difficult to be transferred to a base substrate because irregular pattern bends on the resist underlayer film, called "wiggling", are generated in the dry etching process for processing the base substrate using the resist underlayer film as the mask. Consequently, as the resist underlayer film to serve as the etching mask, the resist underlayer film having high pattern bend resistance that can reduce generation of the pattern bends even in finer patterns is required.

Similar to the resist composition, the film of the resist underlayer film-forming composition is preferably formed using a spin coater from the viewpoint of productivity and economic efficiency. However, in order to achieve excellent application properties, for such an application type resist underlayer film-forming composition, a polymer resin, a crosslinking agent, a crosslinking catalyst, and the like that are the main components of the resist underlayer film-forming composition are required to be dissolved into an appropriate solvent. Typical examples of such solvent may include propylene glycol monomethyl ether (PGME), propylene glycol monomethyl ether acetate (PGMEA), and cyclohexanone, which are used for the resist-forming composition. The resist underlayer film-forming composition is required to have excellent solubility to these solvents.

In the baking process in which the resist underlayer film is formed using the resist underlayer film-forming composition, generation of sublimation components (sublimate) derived from the polymer resin and low molecular weight compounds such as the crosslinking agent and the crosslinking catalyst has become a new problem. Such sublimate adheres and accumulates in the film formation apparatus in the semiconductor device production process to contaminate the inside of film formation apparatus. These contaminations may adhere on wafers as foreign substances, thereby causing defects or other problems. Consequently, the resist underlayer film-forming composition that can reduce the sublimate generated from the resist underlayer film in the baking process is required.

The present invention is aimed at solving the problem described above and an object of the present invention is to provide a resist underlayer film-forming composition that can reduce the pattern bends formed at the time of the base substrate processing, which is generated in the conventional resist underlayer film having high dry etching resistance, has high solubility to the resist solvent for achieving excellent coating film forming properties, and can reduce the sublimate generated at the time of film formation; a method for forming a resist pattern using the resist underlayer film-forming composition; and a method for producing a semiconductor device.

Means for Solving the Problem

The present invention provides, as a first aspect, a resist underlayer film-forming composition comprising a resin obtained by reacting an organic compound A comprising an aromatic ring and an aldehyde B having at least two aromatic hydrocarbon ring groups having a phenolic hydroxy group and having a structure in which the aromatic hydrocarbon ring groups are bonded through a tertiary carbon atom, as a second aspect, the resist underlayer film-forming composition as described in the first aspect, in which the aldehyde B having at least two aromatic hydrocarbon ring groups having a phenolic hydroxy group and having a structure in which the aromatic hydrocarbon ring groups are bonded through a tertiary carbon atom is a compound of Formula (1):

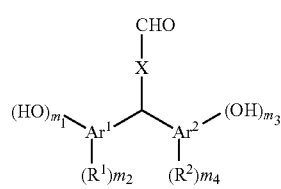

Formula (1)

(in Formula (1), X is a single bond, a $C_{1-10}$ alkylene group, or a $C_{6-40}$ arylene group and $Ar^1$ and $Ar^2$ each are a $C_{6-40}$ aryl group; $R^1$ and $R^2$ each are a $C_{1-10}$ alkyl group, a $C_{2-10}$ alkenyl group, a $C_{6-40}$ aryl group, the $Ar^1$ group, the $Ar^2$ group, a cyano group, a nitro group, a —Y—Z group, a halogen atom, or a combination thereof; Y is an oxygen atom, a sulfur atom, or a carbonyl group and Z is a $C_{6-40}$ aryl group; $m_1$ and $m_3$ each are an integer of 1 to (3+2n); $m_2$ and $m_4$ each are an integer of 0 to (2+2n); $(m_1+m_2)$ and $(m_3+m_4)$ are integers of 1 to (3+2n), with proviso that n is the number of condensed benzene rings in an aryl group of $Ar^1$ and $Ar^2$), as a third aspect, the resist underlayer film-forming composition as described in the first aspect or the second aspect, in which the obtained resin is a resin having a unit structure of Formula (2):

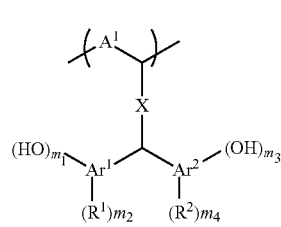

Formula (2)

(in Formula (2), $A^1$ is a group derived from the organic compound A comprising an aromatic ring, and X is a single bond, a $C_{1-10}$ alkylene group, or a $C_{6-40}$ arylene group, and $Ar^1$ and $Ar^2$ each are a $C_{6-40}$ aryl group; $R^1$ and $R^2$ each are a $C_{1-10}$ alkyl group, a $C_{2-10}$ alkenyl group, a $C_{6-40}$ aryl group, the $Ar^1$ group, the $Ar^2$ group, a cyano group, a nitro group, a —Y—Z group, a halogen atom, or a combination thereof; Y is an oxygen atom, a sulfur atom, or a carbonyl group and Z is a $C_{6-40}$ aryl group; $m_1$ and $m_3$ each are an integer of 1 to (3+2n); $m_2$ and $m_4$ each are an integer of 0 to (2+2n); $(m_1+m_2)$ and $(m_3+m_4)$ are integers of 1 to (3+2n), with proviso that n is the number of condensed benzene rings in an aryl group of $Ar^1$ and $Ar^2$), as a fourth aspect, the resist underlayer film-forming composition as described in any one of the first aspect to the third aspect, in which the organic compound A comprising an aromatic ring is an aromatic amine, as a fifth aspect, the resist underlayer film-forming composition as described in the fourth aspect, in which the aromatic amine is aniline, naphthylamine, phenylnaphthylamine, or carbazole, as a sixth aspect, the resist underlayer film-forming composition as described in any one of the first aspect to the third aspect, in which the organic compound A comprising an aromatic ring is a phenolic hydroxy group-containing compound, as a seventh aspect, the resist underlayer film-forming composition as described in the sixth aspect, in which the phenolic hydroxy group-containing compound is phenol, dihydroxybenzene, trihydroxybenzene, hydroxynaphthalene, dihydroxynaphthalene, or trihydroxynaphthalene, as an eighth aspect, the resist underlayer film-forming composition as described in any one of the first aspect to the seventh aspect, further comprising a solvent, as a ninth aspect, the resist underlayer film-forming composition as described in any one of the first aspect to the eighth aspect, further comprising an acid and/or an acid generator, as a tenth aspect, the resist underlayer film-forming composition as described in any one of the first aspect to the ninth aspect, further comprising a crosslinking agent, as an eleventh aspect, a resist underlayer film obtained by applying the resist underlayer film-forming composition as described in any one of the first aspect to the tenth aspect onto a semiconductor substrate and baking the applied resist underlayer film-forming composition, as a twelfth aspect, a method for forming a resist pattern used for semiconductor production, the method comprising the step of: forming a resist underlayer film by applying the resist underlayer film-forming composition as described in any one of the first aspect to the tenth aspect onto a semiconductor substrate and baking the applied resist underlayer film-forming composition, as a thirteenth aspect, a method for producing a semiconductor device, the method comprising the steps of: forming a resist underlayer film from the resist underlayer film-forming composition as described in any one of the first aspect to the tenth aspect onto a semiconductor substrate; forming a resist film on the resist underlayer film; forming a resist pattern by irradiation with light or an electron beam and development; etching the resist underlayer film by using the formed resist pattern; and processing the semiconductor substrate by using the patterned resist underlayer film, as a fourteenth aspect, a method for producing a semiconductor device, the method comprising the steps of: forming a resist underlayer film from the resist underlayer film-forming composition as described in any one of the first aspect to the tenth aspect onto a semiconductor substrate; forming a hard mask on the resist underlayer film; forming a resist film on the hard mask; forming a resist pattern by irradiation with light or an electron beam and development; etching the hard mask by using the formed resist pattern; etching the resist underlayer film by using the patterned hard mask; and processing the semiconductor substrate by using the patterned resist underlayer film, and as a fifteenth aspect, the method for producing a semiconductor device as described in the fourteenth aspect, in which the hard mask is formed by vapor deposition of an inorganic substance.

Effects of the Invention

The resist underlayer film-forming composition of the present invention is effective for a lithography process in which at least two layers of the resist underlayer films aiming at forming the resist film having a thinner film thickness are formed and the resist underlayer films are used as an etching mask. The resist underlayer film-forming composition has not only high dry etching resistance to the etching gas such as fluorocarbon but also sufficient etching resistance to the processing substrate (for example, a thermally oxidized silicon film, a silicon nitride film, and a polysilicon film on the substrate) at the time of processing the substrate using the resist underlayer films of the present invention.

In particular, the resist underlayer film-forming composition of the present invention is an application type composition having high solubility to the resist solvent and excellent spin coating properties. The resist underlayer film obtained from the resist underlayer film-forming composition of the present invention is not dissolved again into the resist solvent after application and baking. In a process for forming a film by baking the resist underlayer film-forming composition, generation of sublimation components (sublimate) derived from the polymer resin and low molecular weight compounds such as the crosslinking agent and the crosslinking catalyst can be reduced. The resist underlayer film-forming composition of the present invention can reduce generation of the wiggling (irregular pattern bends) on the resist underlayer film in the dry etching process for processing the base substrate. This allows the resist pattern formation in the lithography process of the semiconductor production to be easily and accurately carried out.

MODES FOR CARRYING OUT THE INVENTION

The present invention provides a resist underlayer film-forming composition comprising a resin obtained by reacting an organic compound A comprising an aromatic ring and an aldehyde B having at least two aromatic hydrocarbon ring groups having a phenolic hydroxy group and having a structure in which the aromatic hydrocarbon ring groups are bonded through a tertiary carbon atom.

In the present invention, the resist underlayer film-forming composition for lithography contains the resins and a solvent. The resist underlayer film-forming composition optionally contains a crosslinking agent, an acid, an acid generator, a surfactant or the like. The solid content of the composition is 0.1% by mass to 70% by mass or 0.1% by mass to 60% by mass. The solid content is a content ratio of the whole components of the resist underlayer film-forming composition from which the solvent is removed. In the solid content, the polymer can be contained in a ratio of 1% by mass to 100% by mass, or 1% by mass to 99.9% by mass, or 50% by mass to 99.9% by mass, or 50% by mass to 95% by mass, or 50% by mass to 90% by mass.

The polymer used in the present invention has a weight average molecular weight of 600 to 1,000,000 or 600 to 200,000.

As the aldehyde B having at least two aromatic hydrocarbon ring groups having a phenolic hydroxy group and having a structure in which the aromatic hydrocarbon ring groups are bonded through a tertiary carbon atom, an aldehyde having the structure of Formula (1) can be exemplified.

In Formula (1), X is a single bond, a $C_{1-10}$ alkylene group, or a $C_{6-40}$ arylene group and $Ar^1$ and $Ar^2$ each are a $C_{6-40}$ aryl group. $R^1$ and $R^2$ each are a $C_{1-10}$ alkyl group, a $C_{2-10}$ alkenyl group, a $C_{6-40}$ aryl group, the $Ar^1$ group, the $Ar^2$ group, a cyano group, a nitro group, a —Y—Z group, a halogen atom, or a combination thereof. Y is an oxygen atom, a sulfur atom, or a carbonyl group and Z is a $C_{6-10}$ aryl group. $m_1$ and $m_3$ each are an integer of 1 to (3+2n). $m_2$ and $m_4$ each are an integer of 0 to (2+2n). $(m_1+m_2)$ and $(m_3+m_4)$ are integers of 1 to (3+2n). Here, n is the number of the condensed benzene rings in the aryl group of $Ar^1$ and $Ar^2$.

The alkyl group is a $C_{1-10}$ alkyl group and examples of the $C_{1-10}$ alkyl group may include methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl-group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n- propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclopropyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The aryl group is a $C_{6-40}$ aryl group and examples of the aryl group may include phenyl group, o-methylphenyl group, m-methylphenyl group, p-methylphenyl group, o-chlorophenyl group, m-chlorophenyl group, p-chlorophenyl group, o-fluorophenyl group, p-fluorophenyl group, o-methoxyphenyl group, p-methoxyphenyl group, p-nitrophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

The alkenyl group is a $C_{2-10}$ alkenyl group and examples of the $C_{2-10}$ alkenyl group may include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, a 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

As the alkylene group, a divalent organic group derived from the alkyl group can be exemplified. As the arylene group, a divalent organic group derived from the aryl group can be exemplified. Examples of the halogen atom may include a fluorine atom, a chlorine atom, a bromine atom, and an iodine atom.

The aldehyde having the structure of Formula (1), for example, can be exemplified as follows.

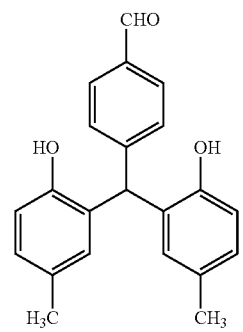

Formula (1-1)

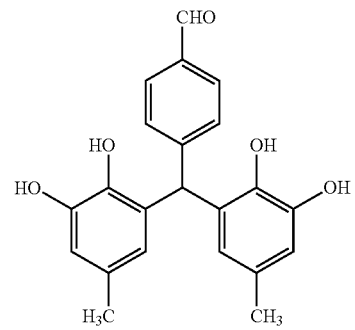

Formula (1-2)

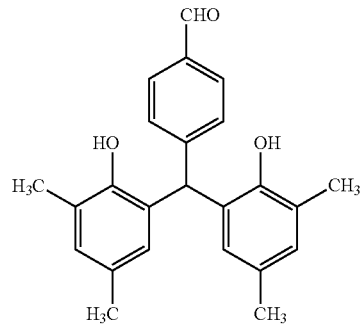

Formula (1-3)

Formula (1-4)

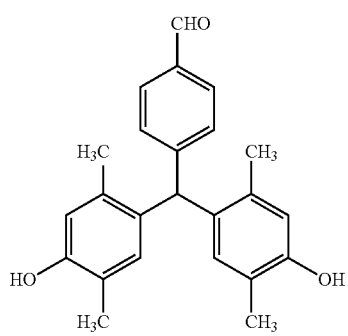

Formula (1-5)

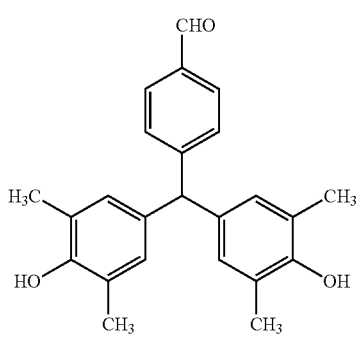

Formula (1-6)

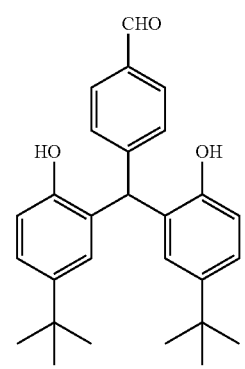

Formula (1-7)

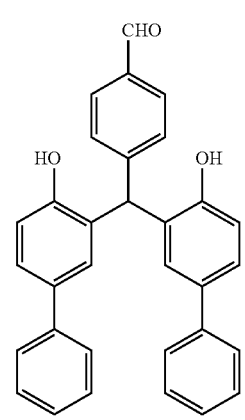

Formula (1-8)

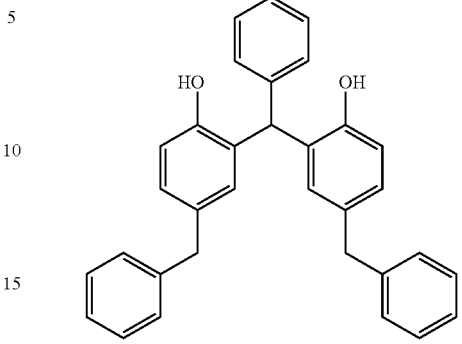

Formula (1-9)

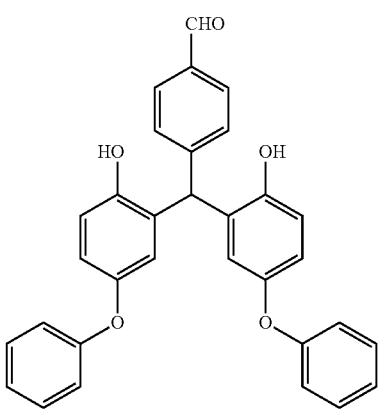

Formula (1-10)

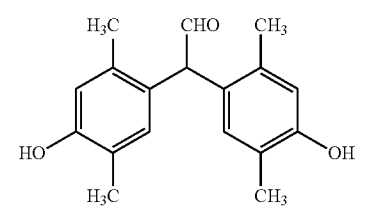

Examples of the organic compound A comprising an aromatic ring may include an aromatic amine and a phenolic hydroxy group-containing compound.

The aromatic amine is preferably a $C_{6-40}$ amine and examples of the aromatic amine may include aniline, naphthylamine, phenylnaphthylamine, and carbazole. Phenylnaphthylamine and carbazole are preferably used.

The phenolic hydroxy group-containing compound includes a $C_{6-40}$ phenolic hydroxy group-containing compound and examples of the phenolic hydroxy group-containing compound may include phenol, dihydroxybenzene, trihydroxybenzene, hydroxynaphthalene, dihydroxynaphthalene, and trihydroxynaphthalene. Phenol is preferably used.

The resin obtained by reacting the organic compound A comprising an aromatic ring and the aldehyde B having at least two aromatic hydrocarbon ring groups having a phenolic hydroxy group and having a structure in which the aromatic hydrocarbon ring groups are bonded through a tertiary carbon atom may include a novolac resin having a structure of Formula (2).

In Formula (2), $A^1$ is a group derived from the organic compound A comprising an aromatic ring, and X is a single bond, a C alkylene group, or a $C_{6-40}$ arylene group, and $Ar^1$ and $Ar^2$ each are a $C_{6-40}$ aryl group. $R^1$ and $R^2$ each are a $C_{1-10}$ alkyl group, a $C_{2-10}$ alkenyl group, a $C_{6-40}$ aryl group, the $Ar^1$ group, the $Ar^2$ group, a cyano group, a nitro group, a —Y—Z group, a halogen atom, or a combination thereof. Y is an oxygen atom, a sulfur atom, or a carbonyl group and Z is a $C_{6-40}$ aryl group. $m_1$ and $m_3$ each are an integer of 1 to (3+2n). $m_2$ and $m_4$ each are an integer of 0 to (2+2n). $(m_1+m_2)$ and $(m_3+m_4)$ are integers of 1 to (3+2n). Here, n is the number of the condensed benzene rings in the aryl group of $Ar^1$ and $Ar^2$. As these groups, the examples described above may be included.

As the reaction of the organic compound A comprising an aromatic ring and the aldehyde B having at least two aromatic hydrocarbon ring groups having a phenolic hydroxy group and having a structure in which the aromatic hydrocarbon ring groups are bonded through a tertiary carbon atom, A and B are preferably reacted in a molar ratio of 1:0.5 to 1.5 or 1:1.

Examples of the usable acid catalyst used in the condensation reaction may include mineral acids such as sulfuric acid, phosphoric acid, and perchloric acid; organic sulfonic acids such as p-toluenesulfonic acid, p-toluenesulfonic acid monohydrate, and methanesulfonic acid; and carboxylic acids such as formic acid and oxalic acid. The amount of the acid catalyst to be used is selected depending on the type of the acid to be used. The amount is usually 0.001 part by mass to 10,000 parts by mass, preferably 0.01 part by mass to 1,000 parts by mass, and more preferably 0.1 part by mass to 100 parts by mass relative to 100 parts by mass of the organic compound A comprising an aromatic ring.

The condensation reaction may be carried out without solvent. The condensation reaction is, however, usually carried out with solvent. All of the solvents can be used as long as the solvents do not inhibit the reaction. Examples of the solvent may include ethers such as 1,2-dimethoxyethane, diethylene glycol dimethyl ether, propylene glycol monomethyl ether, tetrahydrofuran, and dioxane. When the acid catalyst to be used is liquid such as formic acid, the acid catalyst can also act as a solvent.

The reaction temperature at the time of condensation is usually 40° C. to 200° C. The reaction time is variously selected depending on the reaction temperature and usually about 30 minutes to about 50 minutes.

The weight average molecular weight Mw of the polymer thus obtained is usually 500 to 1,000,000 or 600 to 200,000.

The resins obtained by reacting the organic compound A comprising an aromatic ring and the aldehyde B having at least two aromatic hydrocarbon ring groups having a phenolic hydroxy group and having a structure in which the aromatic hydrocarbon ring groups are bonded through a tertiary carbon atom are exemplified as follows.

Formula (2-1)

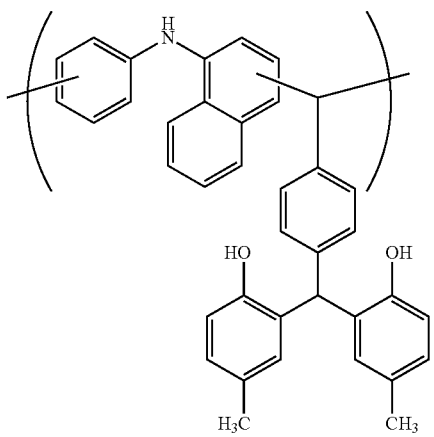

Formula (2-2)

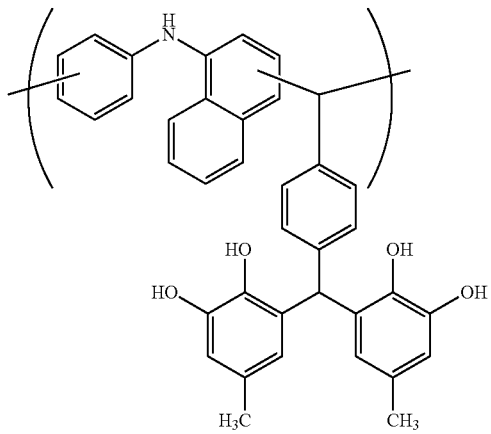

Formula (2-3)

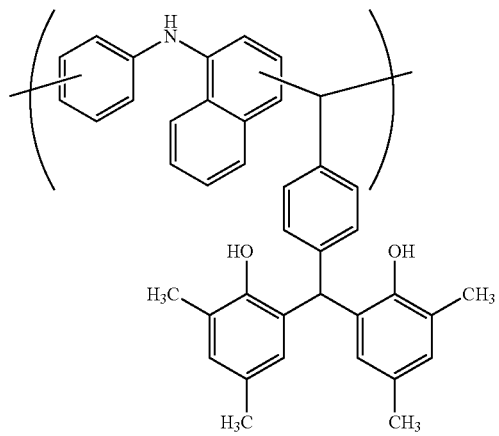

Formula (2-4)

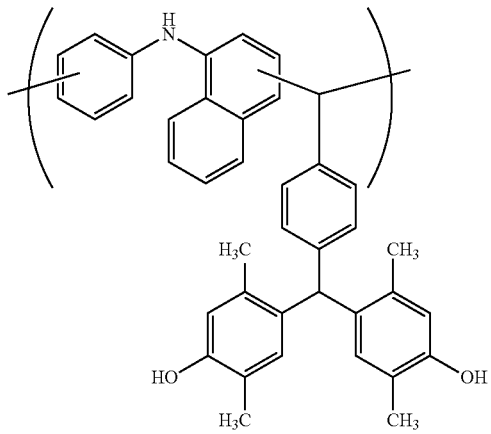

Formula (2-5)
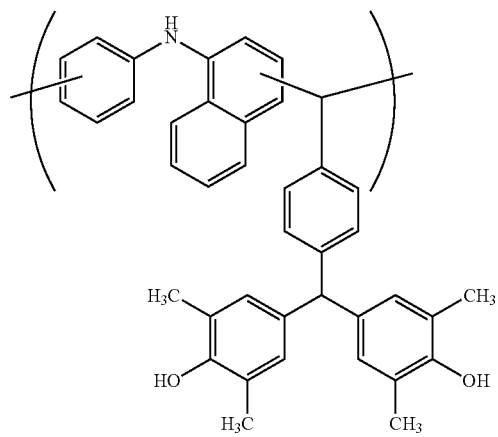
Formula (2-6)
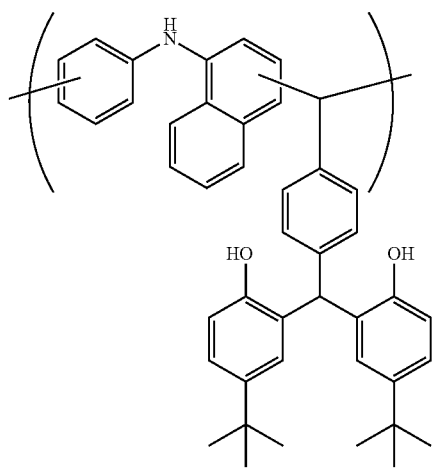
Formula (2-7)
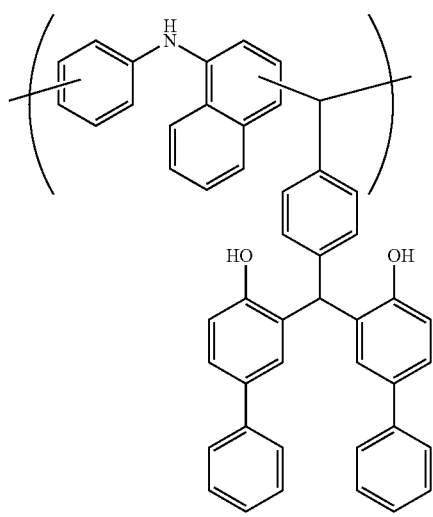
Formula (2-8)
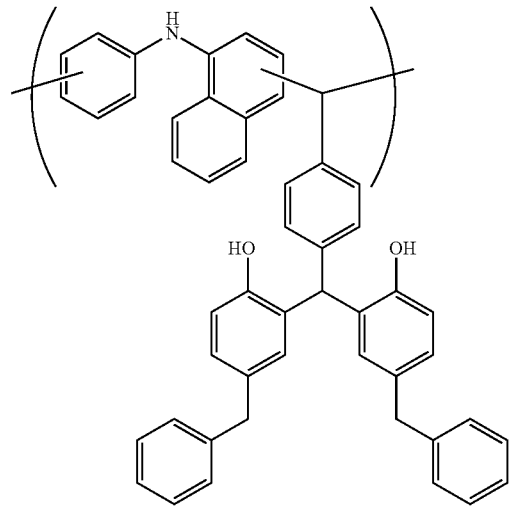
Formula (2-9)
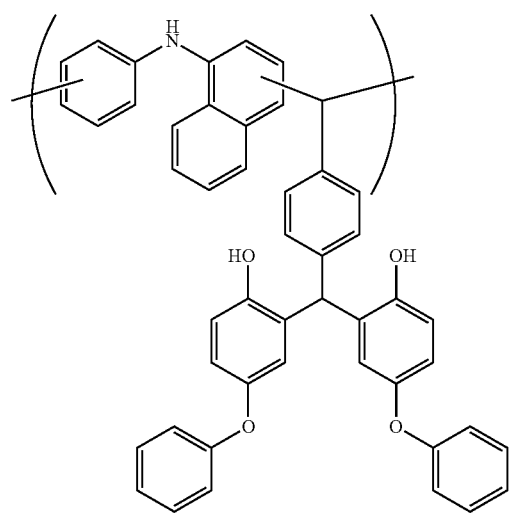
Formula (2-10)
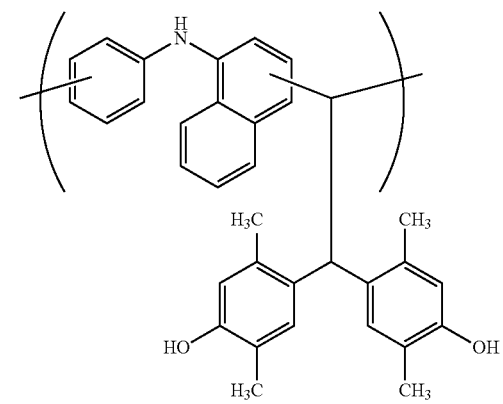

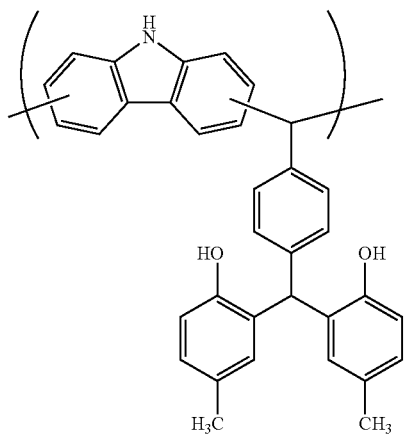

Formula (2-11)

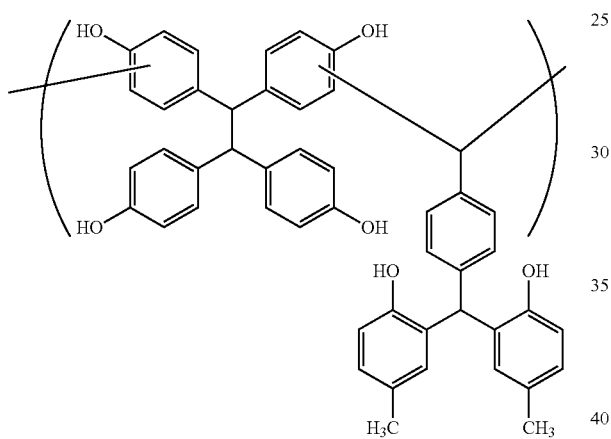

Formula (2-12)

The resist underlayer film-forming composition of the present invention may include a crosslinking agent component. Examples of the crosslinking agent may include a melamine-based agent, a substituted urea-based agent, or a polymer-based agent thereof. Preferably, the crosslinking agent has at least two crosslink-forming substituents. Examples of the crosslinking agent may include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or methoxymethylated thiourea. A condensate of these compounds can also be used.

As the crosslinking agent, a crosslinking agent having high heat resistance can be used. As the crosslinking agent having high heat resistance, a compound containing crosslink-forming substituents having aromatic rings (for example, benzene rings or naphthalene rings) in its molecule can preferably be used.

Examples of the compound may include a compound having a partial structure of Formula (3) and a polymer or oligomer having a repeating unit of Formula (4).

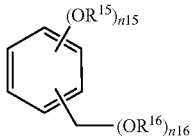

Formula (3)

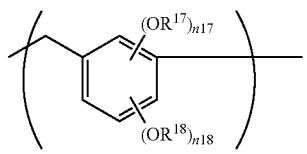

Formula (4)

$R^{15}$, $R^{16}$, $R^{17}$ and $R^{18}$ are hydrogen atoms or $C_{1-10}$ alkyl groups and the alkyl groups exemplified above can be used as these $C_{1-10}$ alkyl groups. In Formula (3) and Formula (4), n15 is an integer of 1 to 5; n16 is an integer of 1 to 5; (n15+n16) is an integer of 2 to 6; n17 is an integer of 1 to 3; n18 is an integer of 1 to 3; and (n17+n18) is an integer of 2 to 4.

The compounds having the partial structure of Formula (3) and the polymers and the oligomers having the repeating unit of Formula (4) are exemplified as follows.

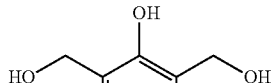

Formula (3-1)

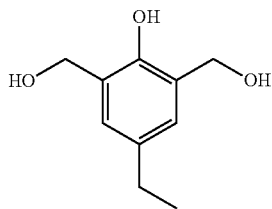

Formula (3-2)

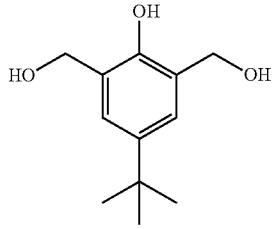

Formula (3-3)

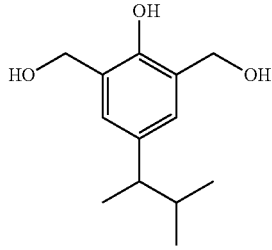

Formula (3-4)

Formula (3-5)

Formula (3-6)

Formula (3-7)

Formula (3-8)

Formula (3-9)

Formula (3-10)

Formula (3-11)

Formula (3-12)

Formula (3-13)

Formula (3-14)

Formula (3-15)

Formula (3-16)

Formula (3-17)

Formula (3-18)

Formula (3-19)

Formula (3-20)
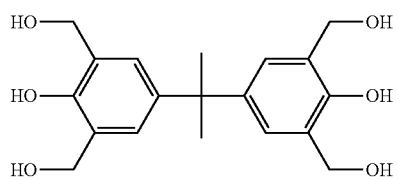

Formula (3-21)
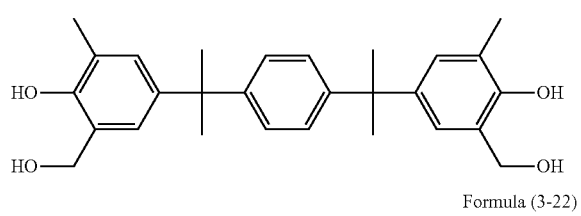

Formula (3-22)
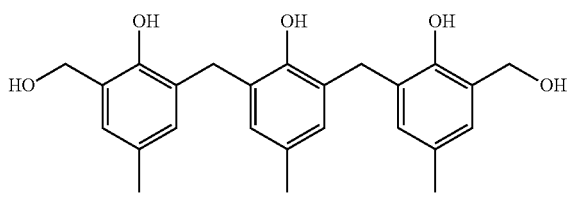

Formula (3-23)
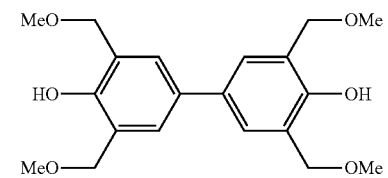

Formula (3-24)
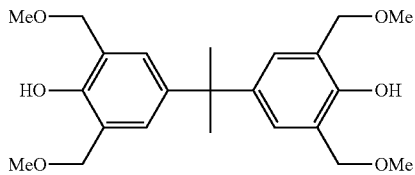

Formula (3-25)
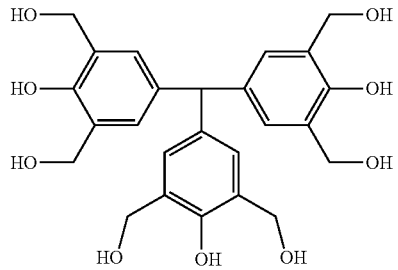

Formula (3-26)
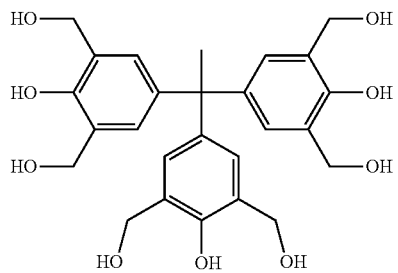

Formula (3-27)
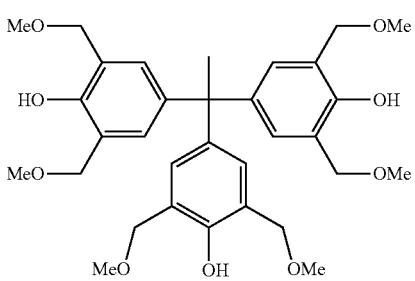

The compounds can be obtained as commercial products manufactured by Asahi Organic Chemicals Industry Co., Ltd. and HONSHU CHEMICAL INDUSTRY CO., LTD. For example, among the crosslinking agent, the compound of Formula (3-24) can be obtained as TM-BIP-A (trade name, manufactured by Asahi Organic Chemicals Industry Co., Ltd.).

An amount of the crosslinking agent to be added varies depending on an application solvent used, a base substrate used, a required solution viscosity, a required film shape, and the like. The amount is 0.001% by mass to 80% by mass, preferably 0.01% by mass to 50% by mass, and further preferably 0.05% by mass to 40% by mass relative to the whole solid content. These crosslinking agents may cause a crosslinking reaction by self-condensation. The crosslinking agent can, however, cause a crosslinking reaction with a crosslinkable substituent when the crosslinkable substituent exists in the polymer of the present invention.

In the present invention, acidic compounds such as p-toluenesulfonic acid, trifluoromethanesulfonic acid, pyridinium p-toluenesulfonate, salicylic acid, 5-sulfosalicylic acid, 4-phenolsulfonic acid, camphorsulfonic acid, 4-chlorobenzenesulfonic acid, benzenedisulfonic acid, 1-naphthalenesulfonic acid, citric acid, benzoic acid, hydroxybenzoic acid, naphthalene carboxylic acid and/or thermal acid generators such as 2,4,4,6-tetrabromocyclohexadienone, benzoin tosylate, 2-nitrobenzyl tosylate, and other organic sulfonic acid alkyl ester can be added as a catalyst for promoting the crosslinking reaction. The amount of the catalyst to be added is 0.0001% by mass to 20% by mass, preferably 0.0005% by mass to 10% by mass, and more preferably 0.01% by mass to 3% by mass relative to the whole solid content.

In order to match the acidity of the resist underlayer film to the acidity of the photoresist that covers the resist underlayer film as an upper layer in the lithography process, a photoacid generator can be added to the resist underlayer film-forming composition for lithography of the present invention. Examples of the preferable photoacid generator may include an onium salt photoacid generators such as bis(4-t-butylphenyl)iodonium trifluoromethanesulfonate and triphenylsulfonium trifluoromethanesulfonate; halogen-containing photoacid generators such as phenyl-bis(trichloromethyl)-s-triazine; and sulfonic acid photoacid generators such as benzoin tosylate and N-hydroxysuccinimide trifluoromethanesulfonate. The amount of the photoacid generator is 0.2% by mass to 10% by mass and preferably 0.4% by mass to 5% by mass relative to the whole solid content.

To the resist underlayer film material for lithography of the present invention, for example, a further light absorbent, a rheology modifier, an adhesion assistance agent, or a surfactant can be added, in addition to the components described above if necessary.

As further light absorbents, for example, commercially available light absorbents described in "Kogyoyo Shikiso no Gijutu to Shijyo (Technology and Market of Industrial Colorant)" (CMC Publishing Co., Ltd) and "Senryo Binran (Dye Handbook)" (The Society of Synthetic Organic Chemistry, Japan) can be preferably used. Preferably useable examples of the commercially available light absorbents include C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2. The light absorbents are usually added in ratio of 10% by mass or less, and preferably in a ratio of 5% by mass or less relative to the whole solid content of the resist underlayer film material for lithography.

The rheology modifier is added for the purpose of mainly improving flowability of the resist underlayer film-forming composition, and, particularly in a baking process, improving film thickness uniformity of the resist underlayer film and enhancing the filling of the resist underlayer film-forming composition in a hole. Specific examples of the rheology modifier may include phthalic acid derivatives such as dimethyl phthalate, diethyl phthalate, diisobutyl phthalate, dihexyl phthalate, and butylisodecyl phthalate, adipic acid derivatives such as di-normal-butyl adipate, diisobutyl adipate, diisooctyl adipate, and octyldecyl adipate, maleic acid derivatives such as di-normal-butyl-maleate, diethyl maleate, and dinonyl maleate, oleic acid derivatives such as methyl oleate, butyl oleate, and tetrahydrofurfuryl oleate, or stearic acid derivatives such as normal-butyl stearate, and glyceryl stearate. These rheology modifiers are usually added in a ratio of less than 30% by mass relative to the whole solid content of the resist underlayer film material for lithography.

The adhesion assistance agent is mainly added so that adhesion is improved between the substrate or the resist and the resist underlayer film-forming composition and the resist is not separated, particularly in development. Specific examples of the adhesion assistance agent may include chlorosilanes such as trimethylchlorosilane, dimethylvinyl-chlorosilane, methyldiphenylchlorosilane, and chloromethyldimethylchlorosilane, alkoxysilanes such as trimethylmethoxysilane, dimethyldiethoxysilane, methyldimethoxysilane, dimethylvinylethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilylimidazole, silanes such as vinyltrichlorosilane, γ-chloropropyltrimethoxysilane, γ-aminopropyltriethoxysilane, and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine, and urea compounds or thiourea compounds such as 1,1-dimethylurea and 1,3-dimethylurea. These adhesion assistance agents are usually added in a ratio less than 5% by mass, and preferably in a ratio of less than 2% by mass relative to the whole solid content of the resist underlayer film material for lithography.

To the resist underlayer film material for lithography of the present invention, a surfactant can be added for preventing generation of pinholes and striations and further improving applicability to surface unevenness. Examples of the surfactant may include nonionic surfactant such as polyoxyethylene alkyl ethers including polyoxyethylene lauryl ether, polyoxyethylene stearyl ether, polyoxyethylene cetyl ether, and polyoxyethylene oleyl ether; polyoxyethylene alkylallyl ethers including polyoxyethylene octylphenol ether and polyoxyethylene nonylphenol ether; polyoxyethylene-polyoxypropylene block copolymers; sorbitan fatty acid esters including sorbitan monolaurate, sorbitan monopalmitate, sorbitan monostearate, sorbitan monooleate, sorbitan trioleate, and sorbitan tristearate; and polyoxyethylene sorbitan fatty acid esters including polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303, and EF352 (manufactured by Tochem Products, trade name), MEGAFAC F171, F173, and R-30 (manufactured by Dainippon Ink and Chemicals Inc., trade name), Fluorad FC430 and FC431 (manufactured by Sumitomo 3M Ltd., trade name), Asahi guard AG710, Surflon S-382, SC101, SC102, SC103, SC104, SC105, and SC106 (manufactured by Asahi Glass Co., Ltd., trade name); and Organosiloxane Polymer KP341 (manufactured by Shin-Etsu Chemical Co., Ltd.). The amount of the surfactant to be added is usually 2.0% by mass or less and preferably 1.0% by mass or less relative to the whole solid content of the resist underlayer film material for lithography of the present invention. These surfactants can be added singly or in combination of two or more of them.

In the present invention, examples of a solvent dissolving the polymer, the crosslinking agent component, and the crosslinking catalyst may include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents can be used singly or in combination of two or more of them.

In addition, these solvents can be used by mixing with a high boiling point solvent such as propylene glycol monobutyl ether and propylene glycol monobutyl ether acetate. Among these solvents, propylene glycol monomethyl ether, propylene glycol monomethyl ether acetate, ethyl lactate, butyl lactate, and cyclohexanone are preferable for improving a levering property.

The resist used in the present invention is a photoresist and an electron beam resist.

As the photoresist applied on upper part of the resist underlayer film for lithography of the present invention, both negative photoresist and positive photoresist can be used. Examples of the resists include a positive photoresist made of a novolac resin and 1,2-naphthoquinonediazidesulfonate, a chemically amplified photoresist made of a binder having a group that increases an alkali dissolution rate by decomposing with an acid and a photoacid generator, a chemically amplified photoresist made of an alkali-soluble binder, a low molecular weight compound that increases an alkali dissolution rate of the photoresist by decomposing with an acid, and a photoacid generator, a chemically amplified photoresist made of a binder having a group that increases an alkali dissolution rate by decomposing with an acid, a low molecular weight compound that increases an alkali dissolution rate of the photoresist by decomposing with an acid, and a photoacid generator, and a photoresist having Si atoms in the framework of the molecule. Specific examples may include APEX-E (trade name, manufactured by Rohm and Haas Inc.)

Examples of the electron beam resist applied on the upper part of the resist underlayer film for lithography of the present invention may include a composition made of a resin containing Si—Si bonds in the main chain and containing aromatic rings at its ends and an acid generator generating an acid by irradiation with electron beams and a composition made of poly(p-hydroxystyrene) in which hydroxy groups are substituted with organic groups containing N-carboxyamine and an acid generator generating an acid by irradiation with electron beams. In the latter electron beam resist composition, the acid generated from the acid generator by the electron beam irradiation is reacted with the N-carboxyaminoxy groups of the polymer side chain and the polymer side chain is decomposed into a hydroxy group to exhibit alkali solubility, Consequently, the resist composition is dissolved into an alkali development liquid to form a resist pattern. Examples of the acid generator generating the acid by electron beam irradiation may include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine, onium salts such as triphenylsulfonium salts and diphenyliodonium salts, and sulfonates such as nitrobenzyltosylate and dinitrobenzyltosylate.

As the development liquid for the resist having the resist underlayer film formed by using the resist underlayer film material for lithography of the present invention, the following aqueous alkali solutions can be used. The aqueous alkali solutions includes solutions of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcoholamines such as dimethylethanolamine and triethanolamine; quaternary ammonium salt such as tetramethylammonium hydroxide, tetraethylammonium hydroxide, and choline; and cyclic amines such as pyrrole and piperidine. To the aqueous solutions of the alkalis described above, an adequate amount of alcohols such as isopropyl alcohol or a surfactant such as a nonionic surfactant can be added and the mixture can be used. Among these development liquids, aqueous solutions of the quaternary ammonium salts are preferable and aqueous solutions of tetraethylammonium hydroxide and choline are further preferable.

Subsequently, a method for forming the resist pattern of the present invention will be described. The resist underlayer film-forming composition is applied onto a substrate (for example, silicon/silicon dioxide coating, a glass substrate and a transparent substrate such as an ITO substrate) used for producing precision integrated circuit elements by an appropriate application method such as a spinner and a coater and thereafter the coated composition is cured by baking to form an application type underlayer film. A film thickness of the resist underlayer film is preferably 0.01 μm to 3.0 μm. Conditions for baking after the application are 80° C. to 400° C. for 0.5 minute to 120 minutes. Thereafter, the resist is directly applied onto the resist underlayer film or applied after a film made of a single layer or several layers of the coating material is formed onto the application type underlayer film if necessary. Thereafter, the resist is irradiated with light or electron beams through the predetermined mask and is developed, rinsed, and dried to be able to obtain an excellent resist pattern. Post Exposure Bake (PEB) of light or electron beams can also be carried out if necessary. The part of the resist underlayer film where the resist is developed and removed by the previous process is removed by dry etching, whereby a desired pattern can be formed on the substrate.

The exposure light of the photoresist is actinic rays such as near ultraviolet rays, far ultraviolet rays, or extreme ultraviolet rays (for example, EUV, wavelength 13.5 nm) and, for example, light having a wavelength of 248 nm (KrF laser light), 193 nm (ArF laser light), or 157 nm ($F_2$ laser light) is used. The light irradiation can be used without limitation as long as the acid is generated from the photoacid generator. An exposure amount is 1 $mJ/cm^2$ to 2,000 $mJ/cm^2$, or 10 $mJ/cm^2$ to 1,500 $mJ/cm^2$, or 50 $mJ/cm^2$ to 1,000 $mJ/cm^2$.

The electron beam irradiation to the electron beam resist can be carried out by, for example, using an electron beam irradiation device.

In the present invention, a semiconductor device can be produced through steps of forming a resist underlayer film by using the resist underlayer film-forming composition onto a semiconductor substrate; forming a resist film on the resist underlayer film; forming a resist pattern by irradiation with light or electron beams and development; etching the resist underlayer film by using the formed resist pattern; and processing the semiconductor substrate by using the patterned resist underlayer film.

When the formation of the finer resist pattern will be progressed in the future, problems of resolution and resist pattern collapse after development will occur and thus formation of a thinner resist film will be desired. Consequently, the film thickness of the resist pattern which is sufficient for substrate processing is difficult to be secured. As a result, not only the resist pattern but also the resist underlayer film formed between the resist and the semiconductor substrate to be processed has been required to have the function as a mask at the time of the substrate processing. As the resist underlayer film for such a process, a resist underlayer film for lithography having the selectivity of dry etching rate close to that of the resist, a resist underlayer film for lithography having the selectivity of dry etching rate smaller than that of the resist, or a resist underlayer film for lithography having the selectivity of dry etching rate smaller than that of the semiconductor substrate, which is different from conventional resist underlayer films having high etch rate properties, has been required. Such a resist underlayer film can be provided with the function of anti-reflective properties and thus can also have the function of an anti-reflective coating.

On the other hand, in order to obtain a finer resist pattern, a process has been also started to be used in which the resist pattern and the resist underlayer film at the time of resist underlayer film dry etching are formed narrower than the pattern width at the time of resist development. As the resist underlayer film for such a process, the resist underlayer film having the selectivity of dry etching rate close to that of the resist, which is different from conventional high etching rate anti-reflective coatings, has been required. Such a resist underlayer film can be provided with the anti-reflective properties and thus can also have the function of the conventional anti-reflective coating.

In the present invention, after the resist underlayer film of the present invention is formed onto the substrate, the resist can be applied directly onto the resist underlayer film or applied after a film made of a single layer or several layers of the coating material is formed onto the resist underlayer film. This makes the pattern width of the resist narrow. Even when the resist is thinly covered in order to prevent pattern collapse, the substrate can be processed by selecting an appropriate etching gas.

More specifically, the semiconductor device can be produced through steps of: forming a resist underlayer film onto a semiconductor substrate using the resist underlayer film-forming composition; forming a hard mask on the resist underlayer film using a coating material containing a silicon component and the like or a hard mask (for example, silicon nitride oxide) by vapor deposition; forming a resist film on the hard mask; forming a resist pattern by irradiation with light or an electron beam and development; etching the hard mask using the formed resist pattern with a halogen-based gas; etching the resist underlayer film using the patterned hard mask with an oxygen-based gas or a hydrogen-based gas; and processing the semiconductor substrate using the patterned resist underlayer film with the halogen-based gas.

In consideration of the effect as the anti-reflective coating, the resist underlayer film-forming composition for lithography of the present invention includes a light absorption site in the skeleton and thus no substances are diffused into the photoresist at the time of drying by heating. The light absorption site has sufficiently large light absorption properties and thus has a high anti-reflection effect.

The resist underlayer film-forming composition for lithography of the present invention has high heat stability, prevents contamination to the upper layer film caused by decomposed substances at the time of baking, and can provide an extra temperature margin during the baking process.

Depending on process conditions, the resist underlayer film material for lithography of the present invention can be used as a film that has the anti-reflection function and further has functions that prevents interaction between the substrate and the photoresist or prevents adverse effect on the substrate due to the materials used for the photoresist or substances generated at the time of exposure to the photoresist.

EXAMPLES

Synthesis Example 1

150 g of xylene was added to 30.00 g of terephthalaldehyde, 80.54 g of p-cresol, and 8.08 g of p-toluenesulfonic acid monohydrate and the reaction liquid was stirred at 40° C. for 39 hours. After the reaction liquid was cooled, the precipitated crystal was filtered and the crystal was washed with toluene. The obtained crystal was extracted with 2-butanone and washed with pure water, and thereafter the organic phase was dried over sodium sulfate. After the solvent of the organic phase was removed by distillation under reduced pressure, hexane was added to the residue and the mixture was stirred. The precipitated crystal was filtered and the obtained crystal was dried under reduced pressure at 50° C. to obtain 60.07 g (yield 81%) of bis(2-hydroxy-5-methylphenyl)-4-formyltoluene (the compound of Formula (1-1)).

Synthesis Example 2

100 g of xylene was added to 25.00 g of terephthalaldehyde, 46.28 g of 4-methylcatechol, and 4.61 g of p-toluenesulfonic acid monohydrate and the reaction liquid was stirred at 40° C. for 60 hours. After the reaction liquid was cooled, the precipitated crystal was filtered and the crystal was washed with toluene. The obtained crystal was extracted with 2-butanone and washed with pure water, and thereafter the organic phase was dried over sodium sulfate. After the solvent of the organic phase was removed by distillation under reduced pressure, hexane was added to the residue and the mixture was stirred. The precipitated crystal was filtered and the obtained crystal was dried under reduced pressure at 50° C. to obtain 55.29 g (yield 81%) of bis(2,3-dihydroxy-5-methylphenyl)-4-formyltoluene (the compound of Formula (1-2)).

Synthesis Example 3

100 g of xylene was added to 13.50 g of terephthalaldehyde, 24.59 g of 2,4-dimethylphenol, and 2.49 g of p-toluenesulfonic acid monohydrate and the reaction liquid was stirred at 40° C. for 66 hours. After the reaction liquid was cooled, the precipitated crystal was filtered and the crystal was washed with toluene. The obtained crystal was extracted with 2-butanone and washed with pure water, and thereafter the organic phase was dried over sodium sulfate. After the solvent of the organic phase was removed by distillation under reduced pressure, hexane was added to the residue and the mixture was stirred. The precipitated crystal was filtered and the obtained crystal was dried under reduced pressure at 50° C. to obtain 23.93 g (yield 66%) of bis(2-hydroxy-3,5-dimethylphenyl)-4-formyltoluene (the compound of Formula (1-3)).

Synthesis Example 4

300 g of xylene was added to 40.00 g of terephthalaldehyde, 72.86 g of 2,5-dimethylphenol, and 8.51 g of p-toluenesulfonic acid monohydrate and the reaction liquid was stirred at 40° C. for 24 hours. After the reaction liquid was cooled, the precipitated crystal was filtered and the crystal was washed with toluene. The obtained crystal was extracted with 2-butanone and washed with pure water, and thereafter the organic phase was dried over sodium sulfate. After the solvent of the organic phase was removed by distillation under reduced pressure, hexane was added to the residue and the mixture was stirred. The precipitated crystal was filtered and the obtained crystal was dried under reduced pressure at 50° C. to obtain 94.33 g (yield 88%) of bis(4-hydroxy-2,5-dimethylphenyl)-4-formyltoluene (the compound of Formula (1-4)).

Synthesis Example 5

100 g of xylene was added to 13.50 g of terephthalaldehyde, 24.59 g of 2,6-dimethylphenol, and 2.49 g of p-toluenesulfonic acid monohydrate and the reaction liquid was stirred at 40° C. for 66 hours. After the reaction liquid was cooled, the precipitated crystal was filtered and the crystal was washed with toluene. The obtained crystal was extracted with 2-butanone and washed with pure water, and thereafter the organic phase was dried over sodium sulfate. After the solvent of the organic phase was removed by distillation under reduced pressure, hexane was added to the residue and the mixture was stirred. The precipitated crystal was filtered and the obtained crystal was dried under reduced pressure at 50° C. to obtain 32.13 g (yield 89%) of bis(4-hydroxy-3,5-dimethylphenyl)-4-formyltoluene (the compound of Formula (1-5)).

Synthesis Example 6

180 g of xylene was added to 30.00 g of terephthalaldehyde, 67.20 g of 4-tert-butylphenyl, and 6.38 g of p-toluenesulfonic acid monohydrate and the reaction liquid was stirred at 40° C. for 14 hours. After the reaction liquid was cooled, the precipitated crystal was filtered and the crystal was washed with toluene. The obtained crystal was extracted with 2-butanone and washed with pure water, and thereafter the organic phase was dried over sodium sulfate. After the solvent of the organic phase was removed by distillation under reduced pressure, hexane was added to the residue and the mixture was stirred. The precipitated crystal was filtered and the obtained crystal was dried under reduced pressure at 50° C. to obtain 29.72 g (yield 32%) of bis(2-hydroxy-5-tert-butylphenyl)-4-formyltoluene (the compound of Formula (1-6)).

Synthesis Example 7

700 g of dichloromethane was added to 20.00 g of terephthalaldehyde, 50.76 g of 4-phenylphenol, and 2.87 g of methanesulfonic acid, and the reaction liquid was stirred for 45 hours in a reflux state. After the reaction liquid was cooled, the precipitated crystal was filtered and the crystal was washed with toluene. The obtained crystal was extracted with 2-butanone and washed with pure water, and thereafter the organic phase was dried over sodium sulfate. After the solvent of the organic phase was removed by distillation under reduced pressure, hexane was added to the residue and the mixture was stirred. The precipitated crystal was filtered and the obtained crystal was washed with diethyl ether and dried under reduced pressure at 50° C. to obtain 20.25 g (yield 30%) of bis(2-hydroxy-5-phenylphenol)-4-formyltoluene (the compound of Formula (1-7)).

Synthesis Example 8

100 g of xylene was added to 18.00 g of terephthalaldehyde, 49.45 g of 4-benzylphenol, and 3.83 g of p-toluenesulfonic acid monohydrate and the reaction liquid was stirred at 40° C. for 36 hours. After the reaction liquid was cooled, the precipitated crystal was filtered and the crystal was washed with toluene. The obtained crystal was extracted with 2-butanone and washed with pure water, and thereafter the organic phase was dried over sodium sulfate. After the solvent of the organic phase was removed by distillation under reduced pressure, hexane was added to the residue and the mixture was stirred. The precipitated crystal was filtered and the obtained crystal was dried under reduced pressure at 50° C. to obtain 30.43 g (yield 47%) of bis(2-hydroxy-5-benzylphenyl)-4-formyltoluene (the compound of Formula (1-8)).

Synthesis Example 9

100 g of xylene was added to 18.00 g of terephthalaldehyde, 49.98 g of 4-phenoxyphenol, and 3.83 g of p-toluenesulfonic acid monohydrate and the reaction liquid was stirred at 40° C. for 84 hours. After the reaction liquid was cooled, the precipitated crystal was filtered and the crystal was washed with toluene. The obtained crystal was extracted with 2-butanone and washed with pure water, and thereafter the organic phase was dried over sodium sulfate. After the solvent of the organic phase was removed by distillation under reduced pressure, hexane was added to the residue and the mixture was stirred. The precipitated crystal was filtered and the obtained crystal was dried under reduced pressure at 50° C. to obtain 34.09 g (yield 52%) of bis(2-hydroxy-5-phenoxyphenyl)-4-formyltoluene (the compound of Formula (1-9)).

Synthesis Example 10

150 g of 4-methyl-2-pentanone was added to 40.00 g of 39% glyoxal aqueous solution, 65.67 g of 2,5-dimethylphenol, and 7.67 g of p-toluenesulfonic acid monohydrate and the reaction liquid was stirred at 60° C. for 23 hours. The reaction liquid was extracted with 4-methyl-2-pentanone and washed with pure water, and thereafter the organic phase was dried over sodium sulfate. After the solvent of the organic phase was removed by distillation under reduced pressure, toluene was added to the residue and the mixture was stirred. The precipitated crystal was filtered and the obtained crystal was washed with hexane, followed by drying the obtained crystal under reduced pressure at 50° C. to obtain 19.61 g (yield 26%) of bis(4-hydroxy-2,5-dimethylphenyl)-4-formylmethane (the compound of Formula (1-10)).

Synthesis Example 11

32.85 g of propylene glycol monomethyl ether was added to 5.50 g of phenyl-1-naphthylamine, 8.34 g of bis(2-hydroxy-5-methylphenyl)-4-formyltoluene obtained in Synthesis Example 1, and 0.24 g of methanesulfonic acid and the reaction liquid was stirred for 5 hours in a reflux state under a nitrogen atmosphere. The reaction liquid was added dropwise to a mixed solvent of methanol/water (60% by mass/40% by mass) and the generated novolac resin was re-precipitated. The obtained resin was filtered, washed, and dried under reduced pressure at 60° C. to obtain 12.87 g of the novolac resin (containing the resin of Formula (2-1)). The weight average molecular weight of the novolac resin measured with GPC in terms of standard polystyrene was 5,900.

Synthesis Example 12

34.72 g of propylene glycol monomethyl ether was added to 5.50 g of phenyl-1-naphthylamine, 9.14 g of bis(2,3-dihydroxy-5-methylphenyl)-4-formyltoluene obtained in Synthesis Example 2, and 0.24 g of methanesulfonic acid and the reaction liquid was stirred for 7 hours in a reflux state under a nitrogen atmosphere. The reaction liquid was added dropwise to a mixed solvent of methanol/water (20% by mass/80% by mass) and the generated novolac resin was re-precipitated. The obtained resin was filtered, washed, and dried under reduced pressure at 60° C. to obtain 12.77 g of the novolac resin (containing the resin of Formula (2-2)). The weight average molecular weight of the novolac resin measured with GPC in terms of standard polystyrene was 4,100.

Synthesis Example 13

34.49 g of propylene glycol monomethyl ether was added to 5.50 g of phenyl-1-naphthylamine, 9.04 g of bis(2- hydroxy-3,5-dimethylphenyl)-4-formyltoluene obtained in Synthesis Example 3, and 0.24 g of methanesulfonic acid and the reaction liquid was stirred for 6 hours in a reflux state under a nitrogen atmosphere. The reaction liquid was added dropwise to a mixed solvent of methanol/water (70% by mass/30% by mass) and the generated novolac resin was re-precipitated. The obtained resin was filtered, washed, and dried under reduced pressure at 60° C. to obtain 13.27 g of the novolac resin (containing the resin of Formula (2-3)). The weight average molecular weight of the novolac resin measured with GPC in terms of standard polystyrene was 5,900.

Synthesis Example 14

37.64 g of propylene glycol monomethyl ether was added to 6.00 g of phenyl-1-naphthylamine, 9.86 g of bis(4-hydroxy-2,5-dimethylphenyl)-4-formyltoluene obtained in Synthesis Example 4, and 0.26 g of methanesulfonic acid and the reaction liquid was stirred for 4 hours in a reflux state under a nitrogen atmosphere. The reaction liquid was added dropwise to a mixed solvent of methanol/water (60% by mass/40% by mass) and the generated novolac resin was re-precipitated. The obtained resin was filtered, washed, and dried under reduced pressure at 60° C. to obtain 14.46 g of the novolac resin (containing the resin of Formula (2-4)). The weight average molecular weight of the novolac resin measured with GPC in terms of standard polystyrene was 5,200.

Synthesis Example 15

34.49 g of propylene glycol monomethyl ether was added to 5.50 g of phenyl-1-naphthylamine, 9.04 g of bis(4-hydroxy-3,5-dimethylphenyl)-4-formyltoluene obtained in Synthesis Example 5, and 0.24 g of methanesulfonic acid and the reaction liquid was stirred for 7 hours in a reflux state under a nitrogen atmosphere. The reaction liquid was added dropwise to a mixed solvent of methanol/water (60% by mass/40% by mass) and the generated novolac resin was re-precipitated. The obtained resin was filtered, washed, and dried under reduced pressure at 60° C. to obtain 12.63 g of the novolac resin (containing the resin of Formula (2-5)). The weight average molecular weight of the novolac resin measured with GPC in terms of standard polystyrene was 4,700.

Synthesis Example 16

34.34 g of propylene glycol monomethyl ether was added to 5.00 g of phenyl-1-naphthylamine, 9.50 g of bis(2-hydroxy-5-tert-butylphenyl)-4-formyltoluene obtained in Synthesis Example 6, and 0.24 g of methanesulfonic acid and the reaction liquid was stirred for 3 hours in a reflux state under a nitrogen atmosphere. The reaction liquid was added dropwise to a mixed solvent of methanol/water (70% by mass/30% by mass) and the generated novolac resin was re-precipitated. The obtained resin was filtered, washed, and dried under reduced pressure at 60° C. to obtain 13.30 g of the novolac resin (containing the resin of Formula (2-6)). The weight average molecular weight of the novolac resin measured with GPC in terms of standard polystyrene was 6,200.

Synthesis Example 17

32.82 g of propylene glycol monomethyl ether was added to 4.50 g of phenyl-1-naphthylamine, 9.37 g of bis(2-hydroxy-5-phenylphenyl)-4-formyltoluene obtained in Synthesis Example 7, and 0.20 g of methanesulfonic acid and the reaction liquid was stirred for 5 hours in a reflux state under a nitrogen atmosphere. The reaction liquid was added dropwise to a mixed solvent of methanol/water (70% by mass/30% by mass) and the generated novolac resin was re-precipitated. The obtained resin was filtered, washed, and dried under reduced pressure at 60° C. to obtain 12.02 g of the novolac resin (containing the resin of Formula (2-7)). The weight average molecular weight of the novolac resin measured with GPC in terms of standard polystyrene was 5,100.

Synthesis Example 18

34.16 g of propylene glycol monomethyl ether was added to 4.50 g of phenyl-1-naphthylamine, 9.94 g of bis(2-hydroxy-5-benzylphenyl)-4-formyltoluene obtained in Synthesis Example 8, and 0.20 g of methanesulfonic acid and the reaction liquid was stirred for 3 hours in a reflux state under a nitrogen atmosphere. The reaction liquid was added dropwise to a mixed solvent of methanol/water (80% by mass/20% by mass) and the generated novolac resin was re-precipitated. The obtained resin was filtered, washed, and dried under reduced pressure at 60° C. to obtain 13.07 g of the novolac resin (containing the resin of Formula (2-8)). The weight average molecular weight of the novolac resin measured with GPC in terms of standard polystyrene was 5,800.

Synthesis Example 19

24.53 g of propylene glycol monomethyl ether was added to 3.21 g of phenyl-1-naphthylamine, 7.16 g of bis(2-hydroxy-5-phenoxyphenyl)-4-formyltoluene obtained in Synthesis Example 9, and 0.14 g of methanesulfonic acid and the reaction liquid was stirred for 30 minutes in a reflux state under a nitrogen atmosphere. The reaction liquid was added dropwise to a mixed solvent of methanol/water (80% by mass/20% by mass) and the generated novolac resin was re-precipitated. The obtained resin was filtered, washed, and dried under reduced pressure at 60° C. to obtain 8.18 g of the novolac resin (containing the resin of Formula (2-9)). The weight average molecular weight of the novolac resin measured with GPC in terms of standard polystyrene was 5,700.

Synthesis Example 20

32.77 g of propylene glycol monomethyl ether was added to 6.00 g of phenyl-1-naphthylamine, 7.78 g of bis(4-hydroxy-2,5-dimethylphenyl)-4-formylmethane obtained in Synthesis Example 10, and 0.26 g of methanesulfonic acid and the reaction liquid was stirred for 22 hours in a reflux state under a nitrogen atmosphere. The reaction liquid was added dropwise to a mixed solvent of methanol/water (20% by mass/80% by mass) and the generated novolac resin was re-precipitated. The obtained resin was filtered, washed, and dried under reduced pressure at 60° C. to obtain 11.78 g of the novolac resin (containing the resin of Formula (2-10)). The weight average molecular weight of the novolac resin measured with GPC in terms of standard polystyrene was 800.

Synthesis Example 21

36.28 g of propylene glycol monomethyl ether was added to 5.50 g, of carbazole, 9.77 g of bis(2-hydroxy-5-methylphenyl)-4-formyltoluene obtained in Synthesis Example 1, and 0.28 g of methanesulfonic acid and the reaction liquid was stirred for 5 hours in a reflux state under a nitrogen atmosphere. The reaction liquid was added dropwise to a mixed solvent of methanol/water (60% by mass/40% by mass) and the generated novolac resin was re-precipitated. The obtained resin was filtered, washed, and dried under reduced pressure at 60° C. to obtain 12.17 g of the novolac resin (containing the resin of Formula (2-11)). The weight average molecular weight of the novolac resin measured with GPC in terms of standard polystyrene was 3,400.

Synthesis Example 22

19.51 g of propylene glycol monomethyl ether was added to 7.00 g of 1,1,2,2-tetrakis(4-hydroxyphenyl)ethane (product name: TEP-DF, manufactured by ASAHI ORGANIC CHEMICALS INDUSTRY CO., LTD.), 5.84 g of bis(2-hydroxy-5-methylphenyl)-4-formyltoluene obtained in Synthesis Example 1, and 0.17 g of methanesulfonic acid and the reaction liquid was stirred for 4 hours in a reflux state under a nitrogen atmosphere. After 10.84 g of tetrahydrofuran was added to dilute the reaction liquid, the diluted solution was added dropwise to a mixed solvent of methanol/water (30% by mass/70% by mass) and the generated novolac resin was re-precipitated. The obtained resin was filtered, washed, and dried under reduced pressure at 60° C. to obtain 11.90 g of the novolac resin (containing the resin of Formula (2-12)). The weight average molecular weight of the novolac resin measured with GPC in terms of standard polystyrene was 5,100.

Synthesis Example 23

37.91 g of toluene was added to 14.04 g of phenyl-1-naphthylamine, 10.00 g of 1-naphthaldehyde, and 1.23 g of methanesulfonic acid and the reaction liquid was stirred for 7 hours in a reflux state under a nitrogen atmosphere. After 25.27 g of tetrahydrofuran was added to dilute the reaction liquid, the diluted solution was added dropwise to methanol and the generated novolac resin was re-precipitated. The obtained resin was filtered, washed, and dried under reduced pressure at 60° C. to obtain 22.31 g of the novolac resin (containing the resin of Formula (5-1)). The weight average molecular weight of the novolac resin measured with GPC in terms of standard polystyrene was 3,400.

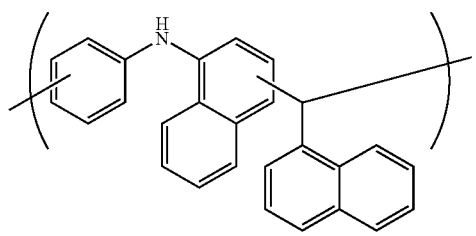

Formula (5-1)

Synthesis Example 24

15.27 g of toluene was added to 9.52 g of phenyl-1-naphthylamine, 10.00 g of 1-pyrenecarboxaldehyde, 0.83 g of methanesulfonic acid, and 15.27 g of 1, 4-dioxane and the reaction liquid was stirred for 19 hours in a reflux state under a nitrogen atmosphere. After 16.96 g of tetrahydrofuran was added to dilute the reaction liquid, the diluted solution was added dropwise to methanol and the generated novolac resin was re-precipitated. The obtained resin was filtered, washed, and dried under reduced pressure at 60° C. to obtain 16.97 g of the novolac resin (containing the resin of Formula (5-2)). The weight average molecular weight of the novolac resin measured with GPC in terms of standard polystyrene was 1,500.

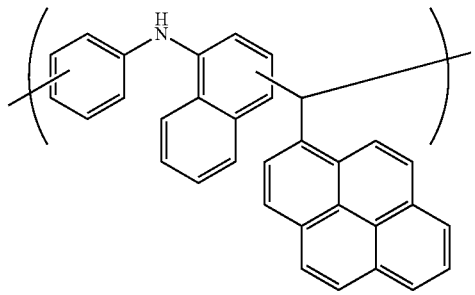

Formula (5-2)

Example 1

2.43 g of the novolac resin obtained in Synthesis Example 11, 0.49 g of 3,3',5,5'-tetrakis(methoxymethyl)-4,4'-dihydroxybiphenyl (product name: TMOM-BP, manufactured by Honshu Chemical Industry Co., Ltd.), 0.07 g of pyridinium p-toluenesulfonate, and 0.01 g of the surfactant (manufactured by DIC Corporation, product name. MEGAFAC [trade name] R-30, fluorochemical surfactant) were dissolved into 18.90 g of propylene glycol monomethyl ether and 8.10 g of propylene glycol monomethyl ether acetate to prepare a resist underlayer film-forming composition to be used for a lithography process.

Example 2

Preparation was carried out in a similar manner to Example 1, except that the novolac resin obtained in Synthesis Example 12 was used instead of the novolac resin obtained in Synthesis Example 11.

Example 3

Preparation was carried out in a similar manner to Example 1, except that the novolac resin obtained in Synthesis Example 13 was used instead of the novolac resin obtained in Synthesis Example 11.

Example 4

Preparation was carried out in a similar manner to Example 1, except that the novolac resin obtained in Synthesis Example 14 was used instead of the novolac resin obtained in Synthesis Example 11.

Example 5

Preparation was carried out in a similar manner to Example 1, except that the novolac resin obtained in Synthesis Example 15 was used instead of the novolac resin obtained in Synthesis Example 11.

Example 6

Preparation was carried out in a similar manner to Example 1, except that the novolac resin obtained in Synthesis Example 16 was used instead of the novolac resin obtained in Synthesis Example 11.

Example 7

Preparation was carried out in a similar manner to Example 1, except that the novolac resin obtained in Synthesis Example 17 was used instead of the novolac resin obtained in Synthesis Example 11.

Example 8

Preparation was carried out in a similar manner to Example 1, except that the novolac resin obtained in Synthesis Example 18 was used instead of the novolac resin obtained in Synthesis Example 11.

Example 9

Preparation was carried out in a similar manner to Example 1, except that the novolac resin obtained in Synthesis Example 19 was used instead of the novolac resin obtained in Synthesis Example 11.

Example 10

Preparation was carried out in a similar manner to Example 1, except that the novolac resin obtained in Synthesis Example 20 was used instead of the novolac resin obtained in Synthesis Example 11.

Example 11

Preparation was carried out in a similar manner to Example 1, except that the novolac resin obtained in Synthesis Example 21 was used instead of the novolac resin obtained in Synthesis Example 11.

Example 12

Preparation was carried out in a similar manner to Example 1, except that the novolac resin obtained in Synthesis Example 22 was used instead of the novolac resin obtained in Synthesis Example 11.

Comparative Example 1

2.43 g of the novolac resin obtained in Synthesis Example 23, 0.49 g of 3,3',5,5'-tetrakis(methoxymethyl)-4,4'-dihydroxybiphenyl (product name: TMOM-BP, manufactured by Honshu Chemical Industry Co., Ltd.), 0.07 g of pyridinium p-toluenesulfonate, and 0.01 g of the surfactant (manufactured by DIC Corporation, product name: MEGAFAC [trade name] R-30, fluorochemical surfactant) were dissolved into 2.70 g of propylene glycol monomethyl ether, 8.10 g of propylene glycol monomethyl ether acetate, and 16.20 g of cyclohexanone to prepare a resist underlayer film-forming composition to be used for a lithography process.

Comparative Example 2

Preparation was carried out in a similar manner to Comparative Example 1, except that the novolac resin obtained in Synthesis Example 24 was used instead of the novolac resin obtained in Synthesis Example 23.

(Solubility Test)

Components (resins) prepared in Examples 1 to 12, Comparative Example 1, and Comparative Example 2 to be used for resist underlayer film-forming compositions were mixed with propylene glycol monomethyl ether (PGME), propylene glycol monomethyl ether acetate (PGMEA), and cyclohexanone (CYH), which are typical resist solvents, so that the ratio was 1 part by mass (solid content of the resist underlayer film-forming composition)/10 parts by mass (resist solvent). It was observed whether precipitation of the components of the resist underlayer film-forming composition derived from the novolac resin from the mixed liquid was detectable. When the precipitation was not observed, the solubility of the components of the resist underlayer film-forming composition was determined to be "good", whereas when the generation of precipitate or turbidity in the mixed liquid caused by precipitation was observed, the solubility of the components of the resist underlayer film-forming composition was determined to be "poor". The results of the solubility test of the components of the resist underlayer film-forming composition are listed in Table 1.

TABLE 1

Solubility test of components of resist underlayer film-forming composition

| Resist underlayer film-forming composition | PGME | PGMEA | CYH |
|---|---|---|---|
| Example 1 | Good | Good | Good |
| Example 2 | Good | Good | Good |
| Example 3 | Good | Good | Good |
| Example 4 | Good | Good | Good |
| Example 5 | Good | Good | Good |
| Example 6 | Good | Good | Good |
| Example 7 | Good | Good | Good |
| Example 8 | Good | Good | Good |
| Example 9 | Good | Good | Good |
| Example 10 | Good | Good | Good |
| Example 11 | Good | Good | Good |
| Example 12 | Good | Good | Good |
| Comparative Example 1 | Poor | Good | Good |
| Comparative Example 2 | Poor | Poor | Good |

As seen from the results listed in Table 1, it was confirmed that the resist underlayer film-forming compositions of Examples 1 to 12 had higher solubility to the typical resist solvents than those of Comparative Example 1 and Comparative Example 2.

Here, the results are the test results that show the solubility of the components (resins) used in Examples 1 to 12, Comparative Example 1, and Comparative Example 2 to the solvents as the components before applying the resist underlayer film-forming composition to the substrate and drying it. After applying the resist underlayer film-forming composition to the substrate and drying it, re-solubility to the resist solvent is not observed.

(Measurement Test of Sublimate)

The sublimate amount was measured with sublimate amount measurement apparatus described in WO 2007/111147 Pamphlet. First, each of the resist underlayer film-forming compositions prepared in Examples 1 to 12 and Comparative Examples 1 and 2 was applied onto a silicon wafer having a diameter of 4 inch with a spin coater so that the film thickness was 90 nm. The wafer onto which the resist underlayer film was applied was placed in the sublimate amount measurement apparatus integrally equipped with a hot plate and baked at 240° C. for 60 seconds to collect the sublimate into a Quartz Crystal Microbalance (QCM) sensor, that is, a quartz oscillator on which electrodes were formed. The QCM sensor can measure a slight mass change by using a property that the frequency of the quartz oscillator changes (decreases) depending on the mass of the sublimate attached to the surface (electrodes: AlSi) of the quartz oscillator. The obtained frequency change was converted to mass unit (gram) based on the specific value of the quartz oscillator used for the measurement to quantify the sublimate amount per wafer onto which the resist underlayer film was applied. The sublimate amount ratios (relative ratios with the sublimate amount in Comparative Example 1 being standardized to 1) were obtained by dividing each of the sublimate amounts quantified with the apparatus in Examples 1 to 12 and Comparative Examples 1 and 2 by the sublimate amount in Comparative Example 1 are listed in Table 2.

TABLE 2

Sublimate amount generated from resist underlayer film

| Resist underlayer film | Sublimate amount ratio |
|---|---|
| Example 1 | 0.50 |
| Example 2 | 0.08 |
| Example 3 | 0.56 |
| Example 4 | 0.36 |
| Example 5 | 0.51 |
| Example 6 | 0.33 |
| Example 7 | 0.14 |
| Example 8 | 0.36 |
| Example 9 | 0.21 |
| Example 10 | 0.51 |
| Example 11 | 0.07 |
| Example 12 | 0.12 |
| Comparative Example 1 | 1.00 |
| Comparative Example 2 | 0.77 |

As seen from the results of Table 2, the sublimate amounts generated from the resist underlayer film-forming compositions of Examples 1 to 12 were smaller than the sublimate amounts generated from the resist underlayer film-forming compositions of Comparative Example 1 and Comparative Example 2. In other words, the resist underlayer film-forming compositions of Example 1 to Example 12 can effectively reduce the sublimate amount to be generated compared with the resist underlayer film-forming compositions of Comparative Example 1 and Comparative Example 2.

(Pattern Bend Resistance Test)

First, each of the resist underlayer film-forming compositions prepared in Examples 1 to 12, Comparative Example 1, and Comparative Example 2 was applied onto a silicon wafer having a diameter of 8 inch with a silicon oxide coating film having a film thickness of 300 nm using a spin coater. The applied film was baked on a hot plate at 400° C. for 2 minutes to form a resist underlayer film so as to have a film thickness of 200 nm. Subsequently, a silicon hard mask-forming composition (a composition in which polyorganosiloxane was dissolved into an organic solvent) was applied onto the resist underlayer film and the applied film was baked at 240° C. for 1 minutes to form a silicon hard mask layer having a film thickness of 45 nm. A resist solution for ArF excimer laser was applied and the applied film was baked at 100° C. for 1 minute to form a resist layer having a film thickness of 120 nm. The resist layer was exposed to ArF excimer laser (wavelength 193 nm) using a mask. After the exposure, the resist layer was baked at 105° C. for 1 minute to carry out heating (PEB) and was developed with alkali to obtain a resist pattern. Thereafter, dry etching was carried out using a fluorine-based gas (the component is $CF_4$) to transfer the resist pattern to the hard mask. In addition, dry etching was carried out using an oxygen-based gas (the component is $O_2/CO_2$) to transfer the formed pattern of the hard mask to the resist underlayer film. Thereafter, dry etching was carried out using a fluorine-based gas (the component is $C_4F_6/C_4F_8/O_2/Ar$) to transfer the pattern of the resist underlayer film to the silicon oxide coating film. The resist pattern and the pattern shapes that were transferred stepwise were observed with a critical dimension scanning electron microscope. In the resist pattern transfer using such stepwise etching processes, irregular pattern bends called "wiggling" are generated while the pattern width is shrunk at the time of silicon oxide coating film processing. Thus, substrate processing based on the pattern transfer in which the pattern in precisely transferred is difficult. By observing generation of such pattern bends of the silicon oxide coating film with the electron microscope, the pattern bend resistance of the resist underlayer film-forming composition of Example 1 to Example 12, Comparative Example 1, and Comparative Example 2 was evaluated. In other words, the pattern bend resistance can be evaluated by measuring the pattern width (processing limit line width) after the resist pattern is formed just before the start of the generation of the pattern bends. The measured values of the processing limit line width after resist pattern formation are listed in Table 3. Here, as the processing limit line width becomes narrower, the resist underlayer film-forming composition can effectively reduce pattern bends and thus finer substrate processing becomes possible.

TABLE 3

Processing limit line width when pattern bends are started to be generated

| Resist underlayer film-forming composition | Processing limit line width |
|---|---|
| Example 1 | 36.38 nm |
| Example 2 | 36.85 nm |
| Example 3 | 39.45 nm |
| Example 4 | 37.11 nm |
| Example 5 | 38.21 nm |
| Example 6 | 39.87 nm |
| Example 7 | 39.22 nm |
| Example 8 | 36.87 nm |
| Example 9 | 37.92 nm |
| Example 10 | 39.36 nm |
| Example 11 | 37.37 nm |
| Example 12 | 35.42 nm |
| Comparative Example 1 | 44.64 nm |
| Comparative Example 2 | 40.81 nm |

As seen from the results of Table 3, each of the resist underlayer film-forming compositions of Examples 1 to 12 has narrower processing limit line width when the pattern bends start to be generated than that of Comparative Example 1 and Comparative Example 2, and thus finer substrate processing is possible. In other words, it is shown that the resist underlayer film-forming compositions of Example 1 to Example 12 have high pattern bend resistance.

INDUSTRIAL APPLICABILITY

As described above, the resist underlayer film material used for the lithography process using the multilayer film of the present invention not only has the high dry etching resistance and the anti-reflective coating function but also has excellent spin coating properties due to high solubility to the resist solvent, which reduces sublimation components to be generated during the baking process of the resist underlayer film-forming composition. By reducing occurrence of wiggling (irregular pattern bends) of the resist underlayer film in the dry etching process, a finer substrate can be processed.

The invention claimed is:

1. A resist underlayer film-forming composition comprising:
a resin obtained by reacting an organic compound A comprising an aromatic ring and an aldehyde B having at least two aromatic hydrocarbon ring groups having a phenolic hydroxy group and having a structure in which the aromatic hydrocarbon ring groups are bonded through a tertiary carbon atom,
wherein the organic compound A comprising an aromatic ring is an aromatic amine.

2. The resist underlayer film-forming composition according to claim 1, wherein the aldehyde B having at least two aromatic hydrocarbon ring groups having a phenolic hydroxy group and having a structure in which the aromatic hydrocarbon ring groups are bonded through a tertiary carbon atom is a compound of Formula (1):

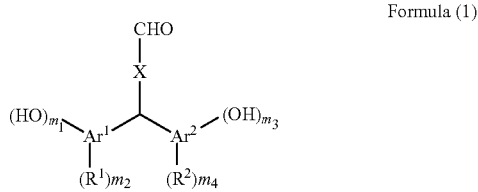

Formula (1)

(in Formula (1), X is a single bond, a $C_{1-10}$ alkylene group, or a $C_{6-40}$ arylene group and $Ar^1$ and $Ar^2$ each are a $C_{6-40}$ aryl group; $R^1$ and $R^2$ each are a $C_{1-10}$ alkyl group, a $C_{2-10}$ alkenyl group, a $C_{6-40}$ aryl group, the $Ar^1$ group, the $Ar^2$ group, a cyano group, a nitro group, a —Y—Z group, a halogen atom, or a combination thereof; Y is an oxygen atom, a sulfur atom, or a carbonyl group and Z is a $C_{6-40}$ aryl group; $m_1$ is an integer of 1 to (3+2n); $m_3$ is an integer of 1 to (3+2p); $m_2$ is an integer of 0 to (2+2n); $m_4$ is an integer of 0 to (2+2p); $(m_1+m_2)$ is an integer of 1 to (3+2n), $(m_3+m_4)$ is an integer of 1 to (3+2p), where n is a number of condensed benzene rings in an aryl group of $Ar^1$ and p is a number of condensed benzene rings in an aryl group of $Ar^2$).

3. The resist underlayer film-forming composition according to claim 1, wherein the obtained resin is a resin having a unit structure of Formula (2):

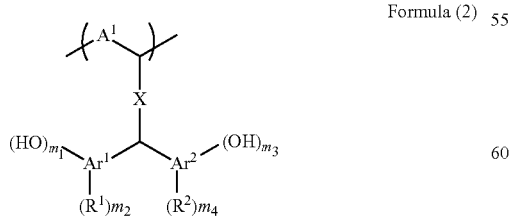

Formula (2)

(in Formula (2), $A^1$ is a group derived from the organic compound A comprising an aromatic ring, and X is a single bond, a $C_{1-10}$ alkylene group, or a $C_{6-40}$ arylene group, and $Ar^1$ and $Ar^2$ each are a $C_{6-40}$ aryl group; $R^1$ and $R^2$ each are a $C_{1-10}$ alkyl group, a $C_{2-10}$ alkenyl group, a $C_{6-40}$ aryl group, the $Ar^1$ group, the $Ar^2$ group, a cyano group, a nitro group, a —Y—Z group, a halogen atom, or a combination thereof; Y is an oxygen atom, a sulfur atom, or a carbonyl group and Z is a $C_{6-40}$ aryl group; $m_1$ is an integer of 1 to (3+2n); $m_3$ is an integer of 1 to (3+2p); $m_2$ is an integer of 0 to (2+2n); $m_4$ is an integer of 0 to (2+2p); $(m_1+m_2)$ is an integer of 1 to (3+2n), $(m_3+m_4)$ is an integer of 1 to (3+2p), where n is a number of condensed benzene rings in an aryl group of $Ar^1$ and p is a number of condensed benzene rings in an aryl group of $Ar^2$).

4. The resist underlayer film-forming composition according to claim 1, wherein the aromatic amine is aniline, naphthylamine, phenylnaphthylamine, or carbazole.

5. The resist underlayer film-forming composition according to claim 1, further comprising:
a solvent.

6. The resist underlayer film-forming composition according to claim 1, further comprising:
an acid and/or an acid generator.

7. The resist underlayer film-forming composition according to claim 1, further comprising:
a crosslinking agent.

8. A resist underlayer film obtained by applying the resist underlayer film-forming composition as claimed in claim 1 onto a semiconductor substrate and baking the applied resist underlayer film-forming composition.

9. A method for forming a resist pattern used for semiconductor production, the method comprising the step of:
forming a resist underlayer film by applying the resist underlayer film-forming composition as claimed in claim 1 onto a semiconductor substrate and baking the applied resist underlayer film-forming composition.

10. A method for producing a semiconductor device, the method comprising the steps of:
forming a resist underlayer film from the resist underlayer film-forming composition as claimed in claim 1 onto a semiconductor substrate;
forming a resist film on the resist underlayer film;
forming a resist pattern by irradiation with light or an electron beam and development;
etching the resist underlayer film by using the formed resist pattern; and
processing the semiconductor substrate by using the patterned resist underlayer film.

11. A method for producing a semiconductor device, the method comprising the steps of:
forming a resist underlayer film from the resist underlayer film-forming composition as claimed in claim 1 onto a semiconductor substrate;
forming a hard mask on the resist underlayer film;
forming a resist film on the hard mask;
forming a resist pattern by irradiation with light or an electron beam and development;
etching the hard mask by using the formed resist pattern;
etching the resist underlayer film by using the patterned hard mask; and
processing the semiconductor substrate by using the patterned resist underlayer film.

12. The method for producing a semiconductor device according to claim 11, wherein the hard mask is formed by vapor deposition of an inorganic substance.

* * * * *